April 12, 1960

C. W. MUELLER

METHOD OF MAKING SURFACE ALLOY JUNCTIONS IN SEMICONDUCTOR BODIES

Filed Sept. 17, 1956

2,932,594

INVENTOR.
Charles W. Mueller
BY J. L. Whittaker
ATTORNEY

United States Patent Office 2,932,594

Patented Apr. 12, 1960

2,932,594

METHOD OF MAKING SURFACE ALLOY JUNCTIONS IN SEMICONDUCTOR BODIES

Charles W. Mueller, Princeton, N.J., assignor to Radio Corporation of America, a corporation of Delaware Application September 17, 1956, Serial No. 610,124

8 Claims. (Cl. 148—1.5)

Figure 1:
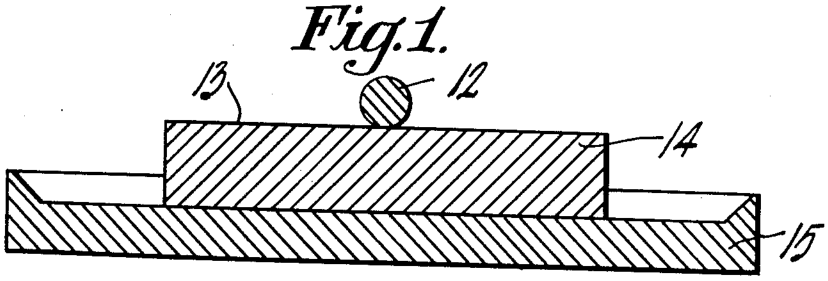

This invention relates to improved semiconductor devices and improved methods of making them. More particularly it relates to improved methods of making surface alloyed junctions of controlled size and configuration.

Semiconductor devices such as crystal diodes and transistors may be fabricated by the so-called surface alloy process. In this technique a pellet or dot of conductivity-type-determining electrode material is positioned on a major surface of a monocrystalline semiconductive wafer of conductivity type opposite to the pellet. The assembly is then heated to a temperature high enough to melt the pellet, but not sufficient to melt or injure the crystal lattice structure of the wafer. The melting point of the electrode material must be appreciably lower than that of the wafer. The molten pellet spreads over the surface of the wafer and dissolves some of the wafer material. On cooling, the dissolved portion of the wafer precipitates first and recrystallizes in its original lattice, i.e., the wafer remains a single crystal. However, this recrystallized portion has become an alloy of the semiconductive wafer material and the pellet material (also known as the impurity), hence the conductivity type of the recrystallized zone is changed. A P–N junction or rectifying barrier is formed at the alloy front, which is the interface between the recrystallized zone and the rest of the wafer. Other types of junctions, such as P–P+ and I–N, may be made by this method.

Several problems are involved in utilizing this technique. Two important problems are the tendency of electrode pellets to spread excessively and irregularly over the surface of the wafer during alloying, and the tendency of a surface alloyed electrode to form a curved rather than a planar alloy front and junction. These difficulties are particularly important in the production of alloy junction transistors wherein an emitter electrode is surface alloyed to one face of a semiconductor base wafer and a collector electrode is surface alloyed to the opposite face in coaxial alignment with the emitter. In such devices it is desirable to keep the capacitance of the collector junction constant. Since capacitance is proportional to area, or radius squared, a small change in dot radius makes a large change in capacitance. To avoid such changes, dot spreading must be controlled. This problem has been aggravated by the advent of the highly purified semiconductors having a substantially perfect lattice structure which are now available as the base wafer, since dot spreading increases on materials which have a more perfect crystal lattice structure. These materials have fewer edge dislocations per unit volume.

If the emitter and collector rectifying barriers are curved, they are generally convex with respect to each other. In such a device, electric charge carriers emitted from different portions of the emitter barrier have different minimum diffusion paths through the base wafer to the collector. Since the speed of the charge carriers in the semiconductor base wafer is finite, this variation in minimum distance traveled by the charge carriers tends to limit the frequency response of the transistor and to distort any impressed signal. Excessive dot spreading may also cause a short circuit to the base electrode. It is therefore desirable to form surface alloyed devices by a method which will prevent dot spreading and will produce rectifying barriers that are substantially flat, planar, and controllably oriented with respect to each other.

Accordingly, one object of the instant invention is to provide improved methods of surface alloying.

Another object is to provide improved methods of making surface alloyed rectifying barriers in semiconductor bodies.

Still another object is to provide improved methods of utilizing low edge dislocation density materials in making semi-conductor devices having electrode dots of controlled and uniform size.

Yet another object is to provide improved semiconductor devices including relatively large area substantially planar rectifying barriers of uniform and controlled size.

These and other objects are accomplished by the instant invention according to which surface alloyed rectifying barriers are formed within semiconductor bodies by a two-stage process under carefully controlled conditions, so that the ambient atmosphere is reducing in the first stage but slightly oxidizing in the final stage.

The invention will be explained in greater detail in connection with the accompanying drawing, in which:

Figures 1 to 4 are schematic cross-sectional views that illustrate successive steps in one embodiment of the method of making P–N junctions in accordance with the present invention.

Similar reference characters have been applied to similar elements throughout the drawing.

It is known that optimum electrical characteristics are obtained when alloy junction devices are fabricated from semiconductor crystals having a minimum of edge dislocations. Edge dislocations are one class of the imperfections in the structure of a crystal. The imperfections are small regions where the regular pattern of the crystal breaks down and some atoms are not properly surrounded by neighbors. The type of imperfections in which one plane of atoms slips partly over another plane, and the slip vector is at right angles to the dislocation, is known as an edge dislocation. See chapters 1 and 2 of "Dislocations in Crystals," by W. T. Read, McGraw-Hill Book Company, Inc., New York, 1953. Germanium normally used for making semiconductor devices has from 1,000 to 10,000 edge dislocations per cm.$^2$. However, monocrystalline germanium can now be produced which has as low as 100 to 800 edge dislocations per cm.$^2$. Excessive and erratic spreading of the impurity dot occurs during alloying when semiconductive material with low edge dislocations density (100 to 800 per cm.$^2$) is used.

It was unexpectedly found that the presence of edge dislocations inhibits the lateral spread of indium pellets on germanium wafers during the alloying process. However, the use of germanium or silicon with a high edge dislocation density for the purpose of reducing laterial dot spreading is not the most desirable solution, because it tends to introduce unsatisfactory electrical characteristics, such as raising the collector saturation current, and reducing the collector break-down voltage.

The present invention provides for the control of the size and flatness of a surface alloyed P–N junction by means of a two-stage process in which the impurity dot, for example indium, is first soldered in a reducing atmosphere at a relatively low temperature to a surface of a semiconductive wafer, for example, germanium, and is thereafter alloyed to the wafer by rapid heating in a slightly oxidizing atmosphere. An embodiment illustrative of one method of carrying out the invention will be described.

Referring to Figure 1 of the drawing, a monocrystalline semiconductor germanium wafer 14, which may be of N-conductivity type, is prepared so that one major surface 13 is substantially parallel to the (111) crystal plane. An electrode pellet 12 consisting of pure indium or an alloy predominantly indium is positioned at the desired site on the major wafer surface 13. For example, the indium may be alloyed with 1 to 5 percent germanium by weight, or with 0.5 to 2 percent zinc by weight, or with 0.5 to 2 percent aluminum or .05 to 0.2 percent gallium by weight to improve emitter efficiency. In this example, the pellet is a sphere of .014 inch diameter made of an alloy of 99.5 percent indium and 0.5 percent zinc. The dot 12 may be maintained in place by any suitable jig (not shown). The assembly of dot, wafer, and jig is then placed in a boat 15 which may be made of an inert heat resistant material such as graphite or quartz. The boat 15 carrying the assembly is then placed in a suitable furnace (not shown), such as a quartz tube with means for controlling the ambient temperature and atmosphere. Electrical heating means are preferred since such means are adaptable to a close degree of control. A reducing atmosphere is maintained in the furnace by sweeping it with pure dried deoxidized hydrogen. The temperature of the furnace is raised at a rate of about 7° C. per second to about 300° C. This temperature is not critical, and may be varied from 250° C. to 350° C. A thermocouple device (not shown) may be inserted in the furnace to measure and keep accurate control of the temperature and the rate of heating.

Figure 2:
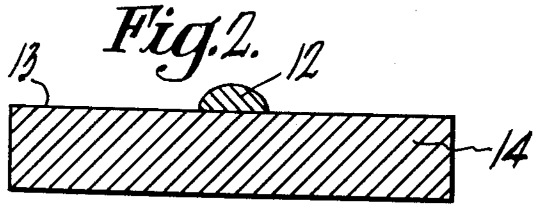

The reducing atmosphere acts as a flux and causes the indium dot 12 to wet the germanium wafer 14 at the desired site. The dot is thus soldered to the wafer and adheres firmly thereto. The dot, which was originally a sphere, flattens out and assumes a characteristic hemispherical shape as shown in Figure 2.

The dot is then alloyed to the wafer by rapidly heating to 550° C. in slightly oxidizing atmosphere. The rate of heating is critical. For good results, the rate of heating should be at least 1,000° C. per minute. Slow heating will result in excessive dot spreading. For best results, the heating should be done at the rate of 1500° C. per minute. This is accomplished by removing the wafer with the soldered dot from the 300° C. furnace and thrusting it into a furnace maintained at 550° C. The second furnace is swept with line nitrogen, which is slightly oxidizing because of its impurities, such as small amounts of oxygen and water vapor. This oxidizing atmosphere causes the formation of a thin film on the molten dot. This film is believed to be an oxide, and acts as a sac to prevent excessive dot spreading. In order to secure the fast rate of temperature rise which is essential for this process, the jig used must have a very low heat capacity. A jig with a large heat capacity cannot be used because of its thermal inertia. A suitable method is to place the germanium wafer bearing the solder dot on a very thin sheet of mica, and thrust the sheet into the alloying furnace which is maintained at 550° C. The wafer and dot assembly is kept at 550° C. for about 3 minutes. This period is not critical, and satisfactory results are obtained when the time in the furnace is extended to 30 minutes. During this period the indium dot becomes molten and dissolves a portion of the semiconductor wafer. The amount of germanium dissolved depends upon the temperature. Thus, at 400° C., 3 percent by weight of germanium is dissolved by a pure indium dot; at 500° C., 6 percent by weight; and at 550° C., the molten pool will consist of a solution of 91 percent indium and 9 percent germanium.

The units are then cooled slowly from 550° C. to 300° C. at a rate of about 10° C. per minute, and are then cooled rapidly at a rate of about 100° C. per minute to room temperature by turning off the power while continuing to sweep line nitrogen through the furnace.

The rate of cooling from 550° C. to 300° C. is important as to the type of junction desired. If the rate of cooling is slow, for example 10° to 20° C. per minute, then nearly all the germanium dissolved by the indium dot will be precipitated before the indium remainder freezes. The precipitated germanium will have time to recrystallize in the same lattice as the wafer. If the cooling is rapid, for example about 100° C. per minute, then some germanium is trapped in the freezing indium dot, and the portion of dissolved germanium which recrystallizes on the original lattice is smaller. This is useful for power transistors, since a heat sink introduced into the dot can be brought closer to the junction.

Figure 3:
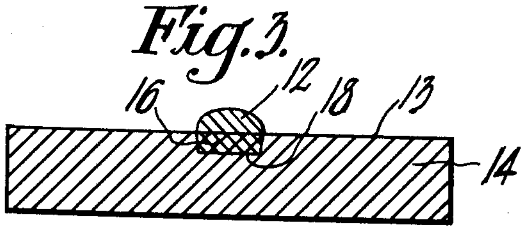

Referring to Figure 3, the cooling step causes the molten indium pellet 12 to freeze and solidify. On cooling, the capacity of the molten dot to maintain germanium in solution is lowered, that is, the solubility of germanium in the melt decreases. As the temperature decreases, increasing amounts of solid germanium are precipitated. When the temperature falls to 400° C., the melt can contain only 3 percent germanium by weight. Since, at 550° C., the melt contained 9 percent germanium, two-thirds of the germanium originally dissolved will have been precipitated out of the melt. Under equilibrium conditions, the surface of the solid germanium wafer in contact with the molten dot will act as a seed for the recrystallizing germanium, and all of the latter will grow upon this surface. If this seed surface is monocrystalline, the regrown germanium will continue the original lattice structure and will be monocrystalline in nature. On further cooling, the remainder of the germanium solidifies. When the temperature falls to 155° C., the molten dot is essentially pure indium which freezes at this temperature. The dissolved germanium recrystallizes in a zone 16 which is of P-conductivity type because it contains some dissolved indium which is an acceptor. A P–N rectifying barrier is formed at the interface 18 between the recrystallized zone 16 and the bulk of the wafer 14. Units made by this method have extremely flat and uniform junctions. In addition, the 14 mil diameter dots spread an average of less than 2.5 mils. Without this technique, the dots spread from 10 to 20 mils.

Figure 4:
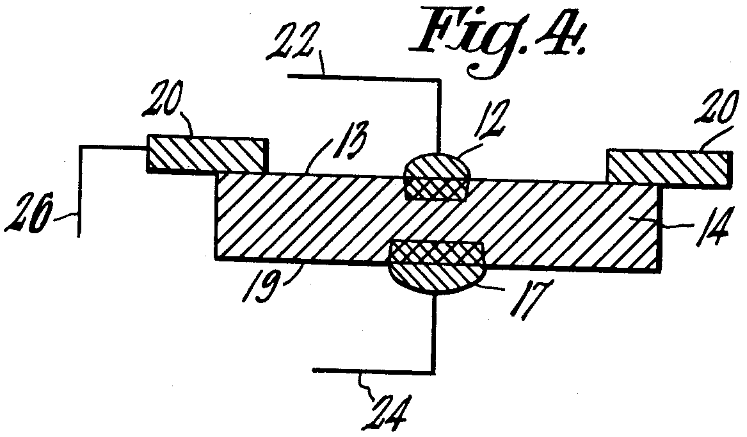

Transistors may also be made by the method of this invention. Referring to Figure 4, an indium emitter dot 12 is positioned on a major surface 13 of an N-conductivity type germanium wafer 14. The wafer has been cut so that the surface 13 is substantially parallel to the (111) plane. A slightly larger indium collector dot 17 is positioned on the opposite surface 19 of the wafer coaxially to the first dot 12. The two electrode dots are kept in place by a jig (not shown) and are simultaneously soldered to the wafer by heating to 300° C. in an atmosphere of dried deoxidized hydrogen as explained above.

Next the wafer is placed on a base tab 20, which may be a ring of nickel or Kovar. The base tab and the two dots are then simultaneously alloyed to the wafer by rapidly heating to 550° C. in a slightly oxidizing atmosphere as explained above. Leads 22, 24, and 26 are then attached to the emitter, collector, and base tab respectively to complete the device.

The invention is not limited to the particular semiconductor material and electrode material described above. It may be practiced, for example, with silicon as the semiconductor wafer material and lead-arsenic or lead-antimony alloy as the electrode dots, or with III–V compounds such as indium phosphide and gallium arsenide as the wafer material and indium-zinc alloy as the electrode dots. Instead of 300° C. and 550° C., other temperatures will be used as the soak temperatures, depending on the particular materials utilized. The method of this invention is particularly suitable for use with devices in which the electrodes are composed principally of indium, and the semiconductor wafers are composed of intrinsic or N-conductivity type germanium and germanium-silicon alloys. The invention is equally suitable for devices such as diodes containing a single rectifying barrier, and for devices such as transistors and tetrodes which contain several rectifying barriers.

What is claimed is:

1. In the surface alloying of impurity pellets to monocrystalline semiconductor wafers, the improvement comprising first soldering the pellet to the desired site on a surface of said wafer by contacting said pellet to said wafer and heating the assembly in a reducing atmosphere to a temperature at which the pellet adheres to the wafer but below the temperature at which the pellet appreciably dissolves the wafer material, then alloying said pellet to said wafer by rapidly heating said assembly at a rate of over 1,000° C. per minute in a slightly oxidizing atmosphere to a predetermined temperature at which the pellet material dissolves the wafer material, thereafter cooling said assembly to room temperature.

2. The method as in claim 1, in which the semiconductor wafer is silicon and the impurity pellet is a lead-arsenic alloy.

3. The method as in claim 1, in which the semiconductor wafer is indium phosphide and the impurity pellet is zinc.

4. The method as in claim 1, in which the semiconductor wafer is gallium arsenide and the impurity pellet is cadmium.

5. In the surface alloying of impurity pellets to monocrystalline germanium wafers, the improvement comprising first soldering the pellet to the desired site on a surface of said wafer by contacting said pellet to said wafer and heating the assembly in a reducing atmosphere to a temperature between 250° C. and 350° C. whereby the pellet adheres to the wafer but does not appreciably dissolve the wafer material, then alloying said pellet to said wafer by rapidly heating said assembly in a slightly oxidizing atmosphere at a rate of about 1500° C. per minute, thereafter cooling said assembly to room temperature.

6. In the surface alloying of impurity pellets to monocrystalline germanium wafers, the improvement comprising first soldering the pellet to the desired site on a surface of said wafer by contacting said pellet to said wafer and heating the assembly in an atmosphere of dried deoxidized hydrogen to a temperature at which the pellet adheres to said wafer but below the temperature at which the pellet appreciably dissolves the wafer material, then alloying said pellet to said wafer by rapidly heating the assembly in an atmosphere of line nitrogen at a rate of over 1,000° C. per minute to about 550° C., maintaining the assembly at about 550° C. for about 3 minutes, and thereafter cooling the assembly to room temperature.

7. In the surface alloying of predominantly indium impurity pellets to monocrystalline germanium wafers, the improvement comprising first soldering the pellet to the desired site on a surface of said wafer by contacting said pellet to said wafer and heating the assembly in an atmosphere of dried deoxidized hydrogen to between 250° C. and 350° C., then alloying said pellet to said wafer by rapidly heating the assembly in an atmosphere of line nitrogen at a rate of about 1500° C. per minute to about 550° C., maintaining the assembly at about 550° C. in line nitrogen atmosphere for about 3 minutes, thereafter cooling the assembly to room temperature.

8. Method of making a semiconductor device comprising the steps of first affixing an electrode to a surface of a monocrystalline N-conductivity type germanium wafer having low edge dislocation density, said electrode being made of material selected from the group consisting of indium, indium with 1 to 5 percent germanium by weight, indium with 0.5 to 2 percent aluminum by weight, indium with .05 to 0.2 percent gallium by weight, and indium with 0.5 to 2 percent zinc by weight, said surface being substantially parallel to the (111) crystallographic planes of said wafer, said affixing comprising heating said electrode in contact with said wafer surface in an atmosphere of dried deoxidized hydrogen to a temperature of about 300° C., next changing the atmosphere to line nitrogen and rapidly heating said wafer with said electrode affixed at the rate of 1500° C. per minute to a temperature of about 550° C., maintaining said wafer with said electrode affixed at a temperature of about 550° C. for about 3 minutes, and subsequently cooling to room temperature, thereby forming a rectifying barrier in said wafer, the major portion of said barrier being substantially parallel to a (111) crystallographic plane of said wafer.

References Cited in the file of this patent

UNITED STATES PATENTS

| | | |
|---|---|---|
| 2,733,390 | Scanlon | Jan. 31, 1956 |
| 2,748,325 | Jenny | May 29, 1956 |
| 2,761,800 | Ditrick | Sept. 4, 1956 |
| 2,785,095 | Pankove | Mar. 12, 1957 |
| 2,825,667 | Mueller | Mar. 4, 1958 |
| 2,836,520 | Longini | May 27, 1958 |
| 2,836,523 | Fuller | May 27, 1958 |
| 2,877,147 | Thurmond | Mar. 10, 1959 |

OTHER REFERENCES

Transistor Manufacture, Fahnestock, Electronics, October 1953, pages 131–134.